US007746057B2

(12) United States Patent  
Melanson

(10) Patent No.: US 7,746,057 B2  
(45) Date of Patent: Jun. 29, 2010

(54) POWER METER HAVING COMPLEX QUADRATURE OUTPUT CURRENT AND VOLTAGE FILTERS

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 176 days.

(21) Appl. No.: 12/057,498

(22) Filed: Mar. 28, 2008

(65) Prior Publication Data

US 2009/0243591 A1 Oct. 1, 2009

(51) Int. Cl.
*G01R 19/22* (2006.01)

(52) U.S. Cl. ............... 324/120; 324/76.28; 324/76.44; 324/158.1

(58) Field of Classification Search ........... 324/120, 324/158.1, 76.28, 76.29, 76.31, 76.44
See application file for complete search history.

(56) References Cited

U.S. PATENT DOCUMENTS

| | | | | |
|---|---|---|---|---|
| 4,096,436 A | * | 6/1978 | Cook et al. | 324/142 |
| 4,206,398 A | * | 6/1980 | Janning | 324/509 |
| 4,713,604 A | * | 12/1987 | Becker et al. | 324/500 |
| 5,347,464 A | * | 9/1994 | McEachern et al. | 702/197 |
| 5,508,623 A | * | 4/1996 | Heydt et al. | 324/623 |
| 5,521,482 A | | 5/1996 | Lang et al. | |
| 5,982,228 A | * | 11/1999 | Khorramabadi et al. | 327/553 |
| 6,211,626 B1 | | 4/2001 | Lys et al. | |
| 6,859,742 B2 | * | 2/2005 | Randall et al. | 702/61 |
| 6,888,322 B2 | | 5/2005 | Dowling et al. | |
| 6,943,714 B2 | | 9/2005 | White | |
| 6,967,448 B2 | | 11/2005 | Morgan et al. | |
| 6,975,079 B2 | | 12/2005 | Lys et al. | |
| 7,064,498 B2 | | 6/2006 | Dowling et al. | |
| 7,092,476 B1 | | 8/2006 | Melanson | |
| 7,135,824 B2 | | 11/2006 | Lys et al. | |
| 7,255,457 B2 | | 8/2007 | Ducharm et al. | |
| 7,403,764 B2 | * | 7/2008 | Turner | 455/410 |
| 7,536,577 B2 | * | 5/2009 | Desai et al. | 713/340 |
| 2004/0253921 A1 | * | 12/2004 | Turner | 455/2.01 |
| 2006/0028197 A1 | * | 2/2006 | Quiquempoix | 324/142 |
| 2006/0116106 A1 | * | 6/2006 | Turner | 455/410 |
| 2007/0067121 A1 | * | 3/2007 | Przydatek et al. | 702/57 |
| 2007/0121675 A1 | * | 5/2007 | Sokolov et al. | 370/479 |
| 2007/0294558 A1 | * | 12/2007 | Desai et al. | 713/340 |

OTHER PUBLICATIONS

Mitrovic, et al., "A Fast and Accurate Method for Phase Angle Autocalibration in the Stable Source of AC Voltage and Current", IMTC 2005—Instrumentation and Measurement Technology Conference, May 2005.

* cited by examiner

*Primary Examiner*—Ha Tran T Nguyen
*Assistant Examiner*—Richard Isla Rodas
(74) *Attorney, Agent, or Firm*—Andrew M. Harris; Mitch Harris, Atty at Law, LLC

(57) ABSTRACT

A power meter having complex quadrature output current and voltage filters provides power measurements in high amplitude and frequency variation and/or high jitter environments without requiring high computational overhead. A pair of filters, one for voltage and one for current each have a response determined by complex non-conjugate poles. The response of the filters is such that only the positive or negative half plane of the complex frequency spectrum is passed and provide complex outputs representing the real and imaginary parts of both the current and voltage. At least one indication of a power delivered to a load is computed from the complex current and voltage outputs, which may be the real and/or reactive power.

21 Claims, 5 Drawing Sheets

US 7,746,057 B2

POWER METER HAVING COMPLEX QUADRATURE OUTPUT CURRENT AND VOLTAGE FILTERS

BACKGROUND OF THE INVENTION

1. Field of the Invention

The present invention relates generally to power measurement circuits and systems, and more particularly to a power measurement system that provides for measurement of complex power, including reactive and real power delivered to a load.

2. Background of the Invention

Power measurements performed by integrated circuits (ICs), such as those used in motor control and power supply systems typically measure voltage and current delivered to a load using analog-to-digital converters (ADCs) and then compute a measured power level by multiplying the voltage and current measurements to obtain a power measurement. Systems such as those disclosed in U.S. Pat. No. 5,521,482 typically assume that the measured power is a real power value, or for A/C power measurements, use a power factor to adjust the power calculated from the voltage and current measurements to obtain the real power. Such power computations are accurate for a fixed-frequency stable sine wave. For DC power measurements, the power factor correction is not needed.

However, making accurate A/C power measurements when the frequency and/or amplitude varies rapidly, such as in some A/C motor control applications, and when jitter is present is very difficult and requires extensive computations in order to preserve accuracy of the measurements. Further, measurement of complex power including both real and reactive power metrics is desirable for total modeling of the load conditions which is useful in monitoring and controlling power delivery in applications such as motor control.

Therefore, it would be desirable to provide a less computation-intensive system and method for performing A/C power measurements. It would further be desirable to provide such a system and method that provides a complex power measurement output.

SUMMARY OF THE INVENTION

The above stated objective of providing complex power measurements with low computational overhead, is provided in a method and system that can be embodied in an integrated circuit or an isolated pair of integrated circuits.

The system includes at least one ADC for measuring voltage and current delivered to a load. A pair of band-pass filters each having a response determined by complex non-conjugate poles, so that only the positive or negative half of the complex frequency plane is passed, is used to filter both the current and voltage measurements to complex outputs. The filter is implemented as an algorithm by a digital signal processor. Alternatively, the filters may be implemented in the analog domain and the voltage and current inputs to the ADC(s) may be filtered prior to conversion. The processor computes at least one indication of power delivered to the load from the complex voltage and current, and can compute the real and/or reactive power.

The system may be embodied in a single integrated circuit, or a pair of integrated circuits isolated by a signal transformer may be implemented, generally with the ADC(s) integrated on a load "side" of the signal transformer and the DSP integrated on an isolated measurement/control side of the signal transformer. Clock and power for the ADC(s) may be supplied through the transformer from the measurement/control side.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses circuits, systems and methods for measuring power in electrical and electronic systems. The present invention is suited for integration in motor control systems and other systems in which measurement of real and imaginary power, e.g., determination of a complex power representation is desirable for providing input to control systems, measuring efficiency and displaying information about the operation of the system. The voltage and current supplied to a load are measured and are filtered using a filter that has complex non-conjugate poles forming a bandpass filter. The filter is tuned such that at the bandpass filter center, the complex output of the filter is maintained in quadrature, providing a true measure of real and imaginary voltage and current components. The imaginary power can then be determined from the imaginary component of the product of the complex voltage and the conjugate of the complex current and the real power can be determined from the real component of the product of the complex voltage and the conjugate of the complex current.

Figure 1:
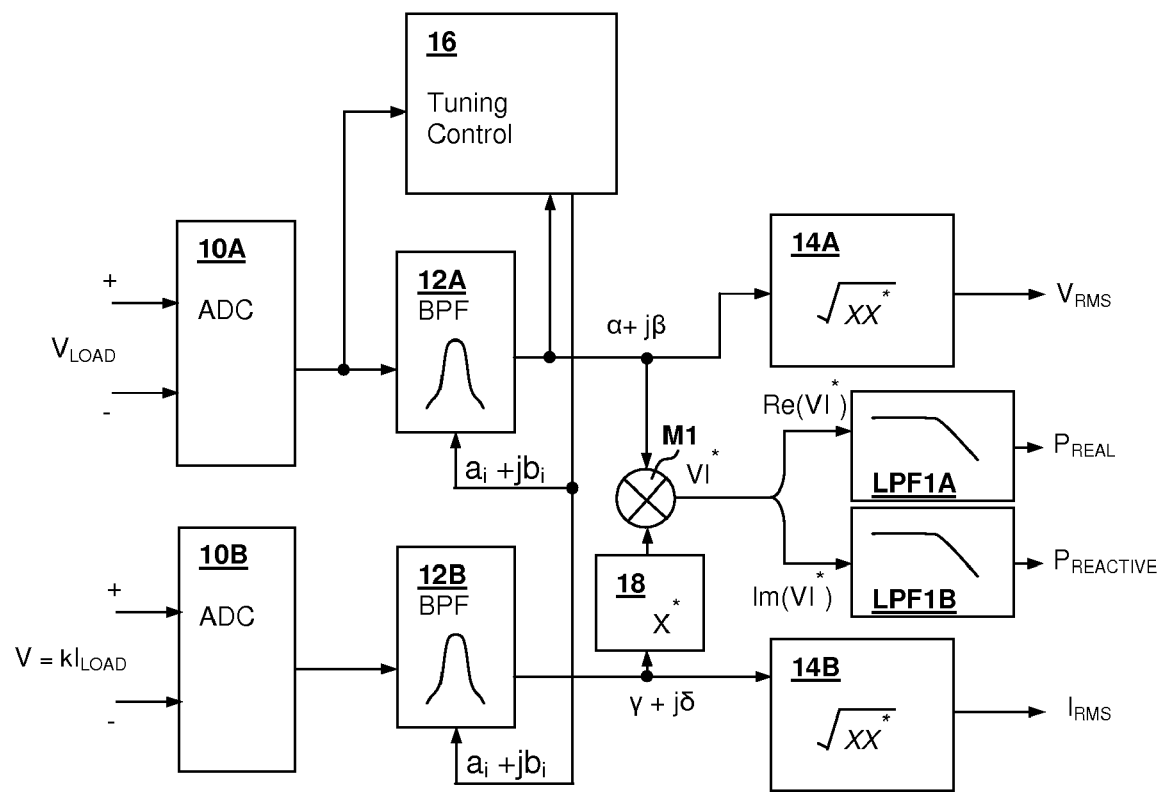
FIG. 1 is a block diagram depicting a power measurement system in accordance with an embodiment of the present invention.

Referring now to FIG. 1, a power measurement system in accordance with an embodiment of the present invention is shown. Two voltages are provided as inputs to the system. The first $V_{LOAD}$, provided to analog-to-digital converter (ADC) 10A, is representative of the voltage supplied to a load, and may be provided directly or by a voltage divider or another suitable scaling circuit. The second voltage $V=kI_{LOAD}$, is representative of the current supplied to the load and may be obtained by series sense resistor, current mirror, current transformer or another suitable current-sensing circuit. If the output of the current-sensing circuit generates a current, then ADC 10B may have a current input rather than having a voltage input as depicted in the Figure. The output of ADC 10A is provided to the input of a bandpass filter 12A, which has a characteristic response such that only one of the negative or positive half-planes of the complex frequency spectrum are passed and the other half-plane is attenuated. The resulting response is generated by complex coefficients $a_i+jb_i$ that yield complex poles and transform the input into a complex output voltage number $\alpha+j\beta$ representative of a real and an imaginary part of load voltage $V_{LOAD}$.

Similarly, input voltage V is filtered by another bandpass filter 12B having a response substantially identical to that of bandpass filter 12A, and therefore generates a complex output current number $\gamma+j\delta$ representative of a real and imaginary part of load current $I_{LOAD}$. The response of bandpass filters 12A and 12B is controlled by coefficients $a_i+jb_i$, which are adjusted by a tuning control block 16, which adjusts coefficients $a_i+jb_i$ so that the imaginary part of the output of bandpass filter 12A is in perfect quadrature with the input to bandpass filter 12A. Alternatively, the tuning control could be applied around bandpass filter 12B. Either arrangement can be used to determine real and imaginary power. However, it is desirable to tune bandpass filters 12A and 12B based on the voltage sensing input of the system, rather than the current sensing input of the system. A harmonic load could otherwise generate an error in the tuning, and in particular for 3-phase systems, certain conditions will lead to zero load current on one phase. In any of the systems in accordance with the present invention, once the tuning criteria is determined, it is applied identically to all of the filters in the system, so that the proper complex phase relationship between the current and voltage measurements is maintained.

For power and voltage measurements, a Root-Mean-Square (RMS) computation block 14A is provided at the output of bandpass filter 12A to obtain the RMS value of the load voltage $V_{RMS}$ and another RMS computation block 14B is provided to obtain the RMS value of the load current $I_{RMS}$. RMS computation blocks 14A and 14B multiply the input value by its conjugate and then perform a square root operation to obtain the RMS value. A conjugate operator block 18 computes the conjugate of the complex load current value by changing the sign of the imaginary component $I_{LOAD}*=\gamma-j\delta$. A multiplier M1 multiplies the output of conjugate operator block 18 with the output of bandpass filter 12A to obtain the complex power VI*, which is used to obtain the power measurements. The real component of the complex power Re(VI*) is filtered by a low-pass filter LPF1A to provide a measure of the real power $P_{REAL}$, and the imaginary component of complex power Im(VI*) is filtered by a low-pass filter LPF1B to obtain a measure of the the reactive power $P_{REACTIVE}$.

The system depicted in FIG. 1, is generally implemented in the digital domain with the exception of mixed-signal ADC circuits 10A and 10B. However, filters 12A and 12B could alternatively be implemented as analog filters and ADCs 10A and 10B relocated to the outputs of filters 12A and 12B. Multiplier M1 could then be implemented in the analog or digital domain, depending on whether the inputs to multiplier M1 are provided from the outputs of ADCs 10A, 10B or from the outputs of filters 12A and 12B, which would have separate imaginary and real output signals provided by each filter.

Figure 2:
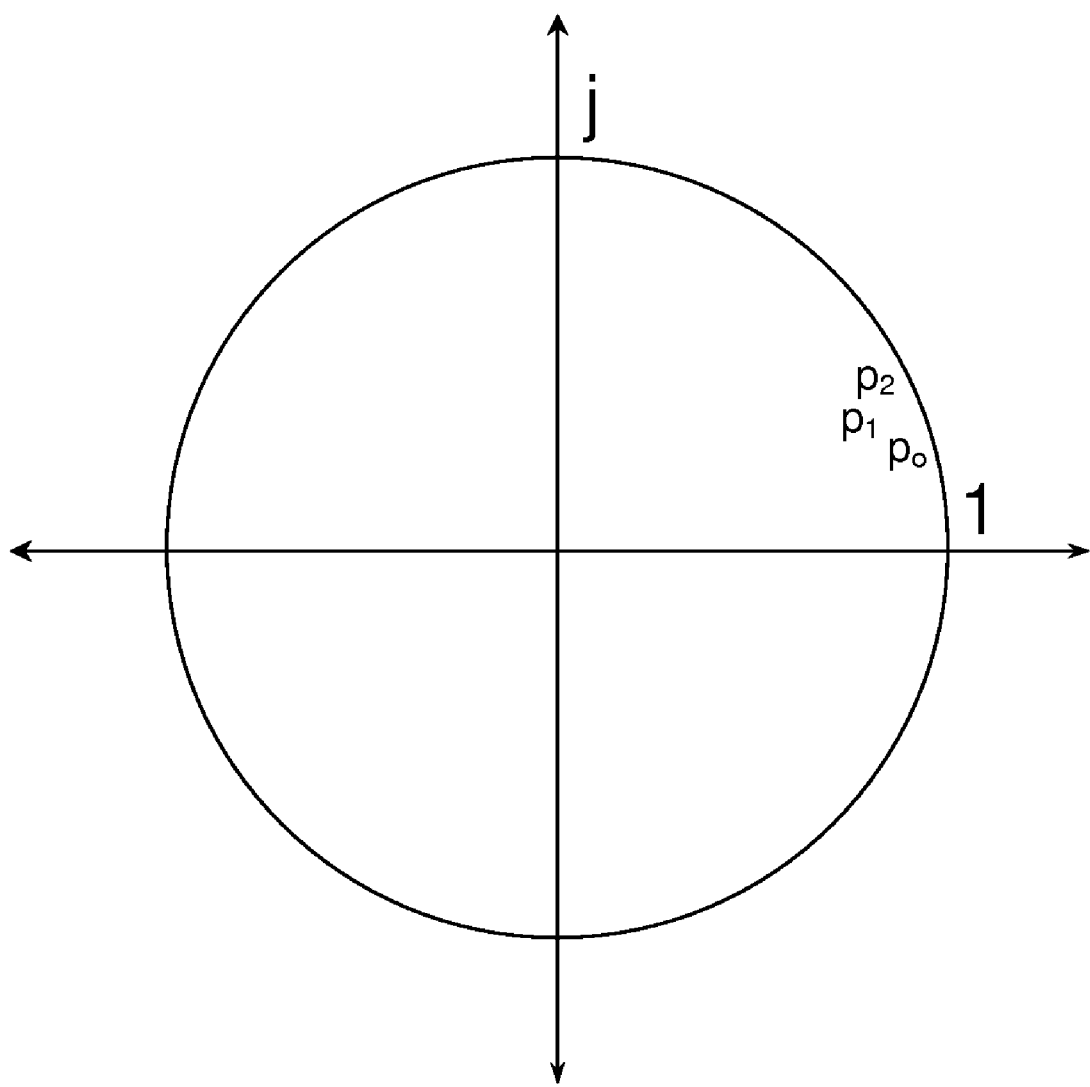
FIG. 2 is a pictorial unit circle diagram showing the locations of the poles of bandpass filters 12A and 12B of FIG. 1.

Referring now to FIG. 2, a unit circle diagram depicting the locations of poles $p_0$, $p_1$, and $p_2$ of the response of bandpass filters 12A and 12B is shown. As depicted in the illustration, poles $p_0$, $p_1$, and $p_2$ are not complex conjugate, but are rotated from the real axis. Poles $p_0$, $p_1$, and $p_2$ of the illustrative bandpass filters 12A and 12B are the real poles of a $3^{rd}$ order Butterworth low-pass response, which are rotated about the origin, yielding a bandpass filter having a complex output. When poles $p_0$, $p_1$, and $p_2$ are adjusted such that the complex output of bandpass filters 12A and 12B are in perfect quadrature, the outputs of bandpass filters 12A and 12B yield the desired imaginary and real components of the input values provided to bandpass filters 12A and 12B.

Figure 3:
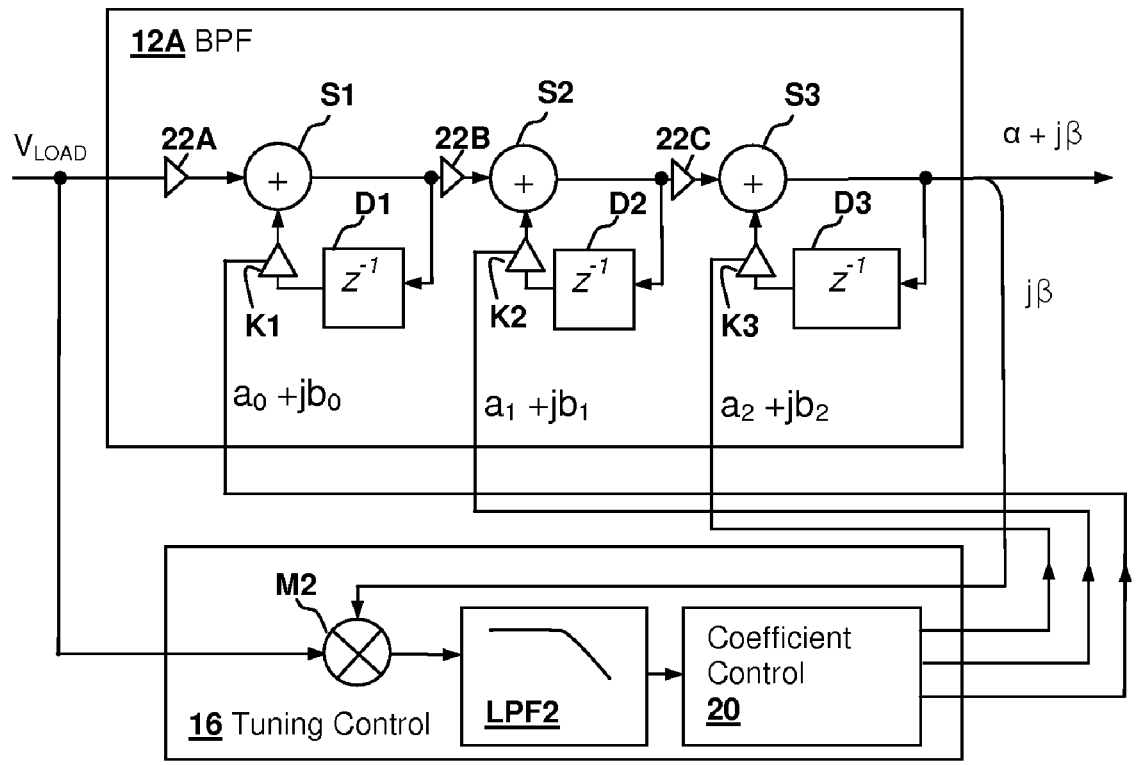
FIG. 3 is a block diagram depicting details of bandpass filter 12A and tuning control block 16 of FIG. 1.

Referring now to FIG. 3, details of tuning control block 16 and bandpass filter 12A are shown. Internal details of bandpass filter 12B are identical to those of bandpass filter 12A and are therefore not shown in the diagram. Bandpass filter 12A is implemented as an infinite impulse response (IIR) filter of order three, by summers S1, S2 and S3, scalers 22A, 22B and 22C, unit delays D1, D2 and D3 and scalers K1, K2, and K3. The coefficients $a_i+jb_i$ of scalers K1, K2, and K3, respectively $a_0+jb_0$, $a_1+jb_1$ and $a_2+jb_2$, are complex, and therefore transform scalar input $V_{LOAD}$ into complex output vector $\alpha+j\beta$. Tuning control block 16 controls coefficients $a_i+jb_i$ by a coefficient control block 20, to minimize (zero) the output of a low-pass filter LPF2 that filters the output of a multiplier M2, which multiplies input voltage $V_{in}$ by the imaginary component $\beta$ of the output of bandpass filter 12A. When the imaginary component $\beta$ of the output of bandpass filter 12A is in perfect quadrature with the input voltage $V_{in}$, the product of $\beta$ and $V_{in}$ is ideally only a second harmonic, due to the phase relationship of 90 degrees in the fundamental, which is enforced by the loop formed between tuning control 16 and bandpass filter 12A. Any phase error results in a DC value at the output of low-pass filter LPF2, which will cause coefficient control 20 to adjust the coefficients to correct the phase at the output of bandpass filter 12B. Since bandpass filter 12B of FIG. 1 is controlled by the same coefficients $a_i+jb_i$ which are independent of the phase of the input signal provided to bandpass filter 12A, a true complex representation of the relationship between the load current and the load voltage is provided by the system of FIG. 1.

Figure 4:
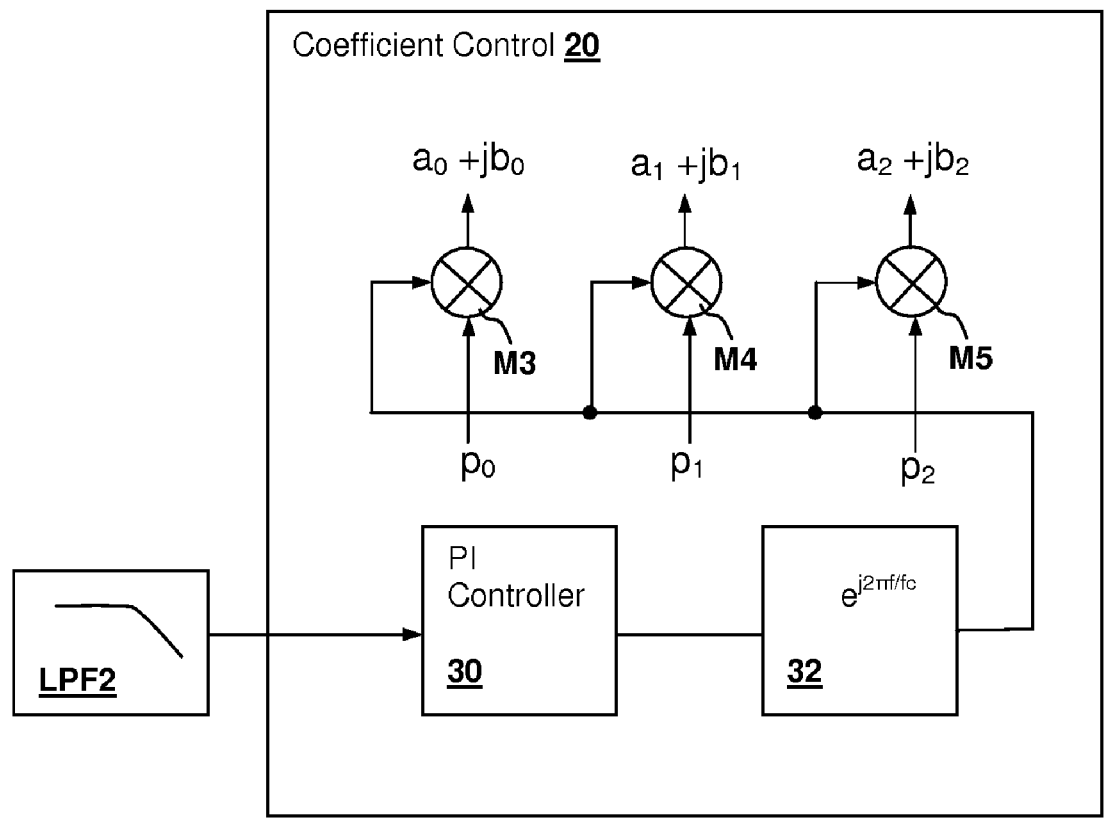
FIG. 4 is a block diagram depicting details of coefficient control block 20 of FIG. 2.

Referring now to FIG. 4, details of coefficient control 20 of FIG. 3 are shown. A set of multipliers M3, M4 and M5 control rotation of poles $p_0$, $p_1$, and $p_2$ by multiplying poles $p_0$, $p_1$, and $p_2$ by a phase number $e^{jw2\pi f/fc}$ generated by block 32 to obtain coefficients $a_0+jb_0$, $a_1+jb_1$ and $a_2+jb_2$, where f is a frequency value input provided to block 32 and $f_c$ is the nominal center frequency of filters 12A and 12B. The input to block 32 is generated by a proportional-integral (PI) controller 30 that receives the output of LPF2 of FIG. 3. As the frequency/phase of the current supplied to the load shifts, the output of multiplier M2 of FIG. 3 rises in value, causing the position of poles $p_0$, $p_1$, and $p_2$ to be rotated to maintain the quadrature relationship between $\delta$ and $V_{in}$ as described above with reference to FIG. 3.

Figure 5:
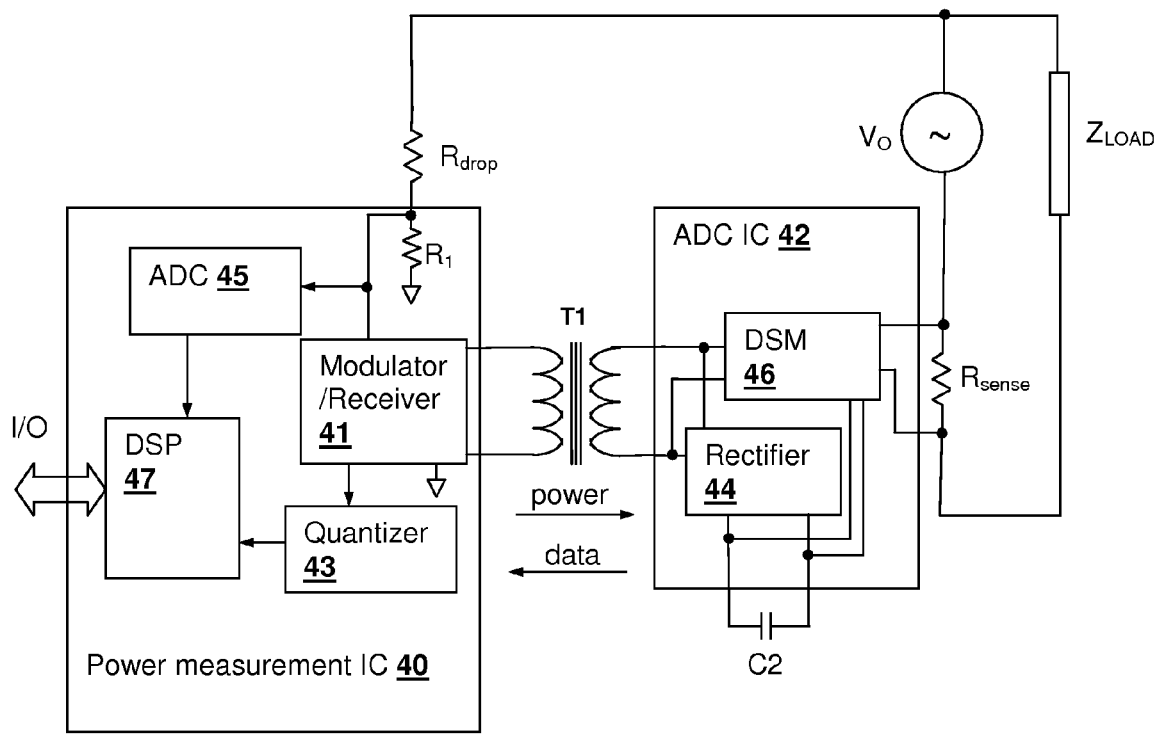
FIG. 5 is a detailed block diagram showing a power measurement system in accordance with another embodiment of the present invention.

Referring now to FIG. 5, a power measurement system in accordance with another embodiment of the present invention is shown. A power measurement integrated circuit 47 contains a digital signal processor (DSP) core 47, which implements bandpass filters 12A and 12B, tuning control 16, and power/voltage/current measurement blocks such as multiplier M1, low-pass filter LPF1 and RMS computation blocks 14A and 14B of FIG. 1. DSP core 47 includes a non-volatile memory containing program instructions for implementing the above-listed algorithmic blocks in accordance with an embodiment of the present invention. Once DSP core 47 has an indication of current and voltage delivered to a load $Z_{LOAD}$ and has processed the current and voltage indications in accordance with the above-described bandpass filter algorithms, the computation of imaginary and/or real power values may be carried out in any manner in order to provide the information to systems that control and/or monitor the power delivered to the load. An ADC 45 provides the indication of voltage to DSP 47, which is obtained from a voltage divider formed by resistors $R_{drop}$ and R1. Power supply voltage for power measurement IC 40 may be obtained from the voltage across resistor R1, which may be replaced with a constant current sink for stability. A modulator/receiver 41 receives data from transformer T1 and may impose a signal on transformer T1 that provides power to a remote ADC integrated circuit 42. The data provided through transformer T1 is illustrated as the output of a delta-sigma modulator (DSM) 46 that converts a voltage detected across a sense resistor $R_{SENSE}$ that represents the current flowing through load $Z_{LOAD}$ as supplied by voltage source $V_O$. A quantizer 43 is included in power measurement IC 40 to quantize the output of delta-sigma modulator 46 in ADC IC 42 to provide the indication of load current to DSP core 47.

Techniques for sending power to and receiving data from an isolated ADC IC such as ADC IC 42 are described in co-pending U.S. patent application Ser. No. 12/037,932, entitled "TRANSFORMER-ISOLATED ANALOG-TO-DIGITAL CONVERTER (ADC) FEEDBACK APPARATUS AND METHOD" and filed on Feb. 26, 2008 by the same inventor. The specification and drawings of the above-referenced U.S. patent application are incorporated herein by reference. The system of FIG. 5 provides an input interface I/O from which measurements of real and imaginary power can be obtained. However, if the circuitry depicted within power measurement IC forms part of an integrated circuit having for example, a motor control circuit for controlling source $V_O$, an output interface may not necessarily be required as the power measurements of the present invention may also be used internal to an integrated circuit controller in order to provide control of power factor, efficiency and in general to further provide input to motor control algorithms. Similarly, other control applications may benefit from the techniques and devices of the present invention, including audio power output systems driving inductive and/or capacitive loads.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A power measurement system comprising:
   a current measurement circuit for measuring a current through a load;
   a first bandpass filter having a bandpass filter response formed by two or more filter stages each having a single complex pole, wherein the poles of each of the stages have a frequency relationship in the complex plane other than a conjugate frequency relationship, wherein the first bandpass filter has an input coupled to an output of the current measurement circuit and provides complex current output components having a substantially quadrature phase relationship throughout a pass-band of the first bandpass filter, and wherein the first bandpass filter response rejects one of a positive or a negative half of a complex frequency spectrum;
   a voltage measurement circuit for measuring a voltage across terminals of the load;
   a second bandpass filter having a response substantially identical to the bandpass filter response, wherein the second bandpass filter has an input coupled to an output of the voltage measurement circuit and provides complex voltage output components having a substantially quadrature phase relationship throughout a pass-band of the second bandpass filter; and
   a processing system for receiving the complex current output components and the complex voltage output components and providing at least one indication of a power provided to the load.

2. The power measurement system of claim 1, wherein the complex current output components comprise separate imaginary current and real current waveform information, and wherein the complex voltage output components comprise separate imaginary voltage and real voltage waveform information.

3. The power measurement system of claim 1, wherein the complex current output components comprise a complex representation of a current waveform, and wherein the complex voltage output components comprise a complex representation of a voltage waveform.

4. The power measurement system of claim 1, wherein the current measuring circuit comprises a first analog-to-digital converter, wherein the voltage measuring circuit comprises a second analog-to-digital converter, and wherein the first bandpass filter and the second bandpass filter are digital filters.

5. The power measurement system of claim 1, further comprising a tuning circuit for adjusting the first bandpass filter response such that one of the complex current output components is maintained in a quadrature relationship with the input to the first bandpass filter.

6. The power measurement system of claim 5, wherein the tuning circuit further adjusts the second bandpass filter response.

7. The power measurement system of claim 6, wherein the tuning circuit comprises:
   a multiplier for multiplying one of the complex components of the output of a given one of the first bandpass filter or the second bandpass filter with an input signal provided to the given bandpass filter; and
   a control circuit for adjusting coefficients of the bandpass response according to a phase determined in conformity with an output of the multiplier.

8. The power measurement system of claim 7, wherein the control circuit comprises a proportional integral controller for receiving an output of the multiplier and generating a phase control signal for adjusting the coefficients of the bandpass response.

9. The power measurement system of claim 1, further comprising an isolation transformer for isolating the current measurement circuit and the voltage measurement circuit from the processing system, wherein the complex voltage and current output components are conveyed to the processing system by a modulated signal imposed on a first winding of the transformer and detected at a second winding of the transformer.

10. The power measurement system of claim 9, wherein the first and second bandpass filters receive inputs from the signal detected at the second winding of the transformer, wherein the current measurement circuit and the voltage measurement circuit are isolated from the first and second bandpass filters and the processing system by the transformer.

11. A method of measuring electrical power supplied to a load, comprising:
   first measuring a current through the load;
   first filtering a result of the first measuring with a bandpass filter response formed by two or more filter stages each having a single complex pole, wherein the poles of each of the stages have a frequency relationship in the complex plane other than a conjugate frequency relationship, to provide complex current output components having a substantially quadrature phase relationship throughout a pass-band of the first bandpass filter;
   second measuring a voltage across terminals of the load;
   second filtering a result of the second measuring with the bandpass filter response, to provide complex voltage output components having a substantially quadrature phase relationship throughout a pass-band of the second bandpass filter; and processing the complex current output components and the complex voltage output components to compute at least one indication of a power provided to the load.

12. The method of claim 11, wherein the complex current output components comprise separate imaginary current and real current waveform information, and wherein the complex voltage output components comprise separate imaginary voltage and real voltage waveform information.

13. The method of claim 11, wherein the complex current output components comprise a complex representation of a current waveform, and wherein the complex voltage output components comprise a complex representation of a voltage waveform.

14. The method of claim 11, wherein the first and second filtering are performed with digital filters.

15. The method of claim 11, further comprising automatically adjusting the bandpass filter response of the first and second filtering such that one of the complex current output components is maintained in a quadrature relationship with a given one of the result of the first measuring or the result of the second measuring.

16. The method of claim 15, wherein the tuning comprises:
detecting an error representing deviation from the quadrature relationship; and
adjusting coefficients of the first and second filtering according to a phase determined in conformity with a result of the detecting.

17. The method of claim 16, wherein the detecting is performed by multiplying one of the components of the result of the given one of the first or second filtering with the input provided to the given one of the first or second filtering, and wherein the adjusts the coefficients of the first and second filtering by rotating a set of fixed pole values by multiplying each of the set of fixed pole values by a complex adjustment value determined in conformity with the detected deviation from the quadrature relationship.

18. The method of claim 11, further comprising transformer isolating at least one of the result of the first measuring or the result of the second measuring wherein the first filtering and second filtering are performed by circuits isolated from a circuit performing the first measuring or the second measuring.

19. The method of claim 11, wherein the first measuring includes converting the measured current to a digital current value, wherein the second measuring includes converting the measured voltage to a digital voltage value, wherein the first filtering, the second filtering and the processing are performed with a digital signal processing algorithm executed by a digital signal processor.

20. A power measurement system comprising:
a current measurement circuit for measuring a current through a load;
a first analog-to-digital converter for converting an output of the current measurement circuit to a digital current value;
a voltage measurement circuit for measuring a voltage across terminals of the load;
a second analog-to-digital converter for converting an output of the voltage measurement circuit to a digital voltage value; and
a digital signal processing system that receives the digital current value and the digital voltage values and filters each of the digital current value and the digital voltage value with a bandpass filter response formed by two or more filter stages each having a single complex pole, wherein the poles of each of the stages have a frequency relationship in the complex plane other than a conjugate frequency relationship, wherein the bandpass filter response rejects one of a positive or a negative half of a complex frequency spectrum, and generates complex output components having a substantially quadrature phase relationship throughout a pass-band of the filtering and wherein the digital signal processing system combines a result of the filtering of the digital current value and a result of the filtering of the digital voltage value to determine an indication of a power provided to the load.

21. A computer program product comprising computer readable storage media containing program instructions for execution by a digital signal processing core, the program instructions including program instructions for:
first receiving a representation of a current through a load;
first filtering a result of the first measuring with a a bandpass filter response formed by two or more filter stages each having a single complex pole, wherein the poles of each of the stages have a frequency relationship in the complex plane other than a conjugate frequency relationship, to provide complex current output components having a substantially quadrature phase relationship throughout a pass-band of the first filtering;
second receiving a representation of a voltage across terminals of the load;
second filtering a result of the second measuring with the bandpass filter response, to provide complex voltage output components having a substantially quadrature phase relationship throughout a pass-band of the second filtering; and
processing the complex current output components and the complex voltage output components to compute at least one indication of a power provided to the load.

* * * * *